United States Patent
Teh

(10) Patent No.: US 11,600,993 B2
(45) Date of Patent: Mar. 7, 2023

(54) SEMICONDUCTOR PROTECTION CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Chen Kong Teh, Ota Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/390,044

(22) Filed: Jul. 30, 2021

(65) Prior Publication Data

US 2022/0285933 A1 Sep. 8, 2022

(30) Foreign Application Priority Data

Mar. 8, 2021 (JP) .............................. JP2021-036081

(51) Int. Cl.
*H02H 9/04* (2006.01)
*H01L 29/78* (2006.01)
*H01L 27/02* (2006.01)

(52) U.S. Cl.
CPC ......... *H02H 9/046* (2013.01); *H01L 27/0266* (2013.01); *H01L 29/7801* (2013.01)

(58) Field of Classification Search
CPC .. H02H 9/046; H01L 27/0266; H01L 29/7801
USPC .......................................................... 361/56
See application file for complete search history.

(56) References Cited

U.S. PATENT DOCUMENTS

| 2010/0302693 | A1 | 12/2010 | Hayashi | |
| 2010/0315748 | A1* | 12/2010 | Kwong | H03K 19/018557 361/56 |
| 2013/0154601 | A1* | 6/2013 | Snowdon | G05F 1/571 361/18 |
| 2013/0222954 | A1* | 8/2013 | Demange | H01L 27/0285 361/56 |
| 2014/0111893 | A1* | 4/2014 | Kato | H02H 9/046 361/56 |
| 2014/0285932 | A1* | 9/2014 | Miyamoto | H02H 9/005 361/56 |

(Continued)

FOREIGN PATENT DOCUMENTS

| JP | 2010-278188 A | 12/2010 |
| JP | 2014-187288 A | 10/2014 |
| JP | 2020-036147 A | 3/2020 |

*Primary Examiner* — Dharti H Patel
(74) *Attorney, Agent, or Firm* — Allen & Overy LLP

(57) ABSTRACT

According to one embodiment, a semiconductor protection circuit includes a first MOS transistor that has a drain that is connected to an input terminal, a source that is connected to an output terminal, and a gate that is connected to a control terminal, a second MOS transistor that has a drain that is connected to the gate of the first MOS transistor and a source that is connected to the source of the first MOS transistor, a rectifier element that is connected in a forward direction from a gate of the second MOS transistor to the gate of the first MOS transistor, and a low-pass filter that is connected between the gate and the source of the second MOS transistor.

21 Claims, 6 Drawing Sheets

(56) References Cited

U.S. PATENT DOCUMENTS

2014/0368958 A1* 12/2014 Ikimura ................. H02H 9/046
  361/56
2015/0049403 A1* 2/2015 de Raad ........... H03K 19/00315
  361/56

* cited by examiner

SEMICONDUCTOR PROTECTION CIRCUIT

CROSS-REFERENCE TO RELATED APPLICATIONS

The present application claims the benefit of priority to Japanese Patent Application No. 2021-036081 filed on Mar. 8, 2021, the entire contents of which Japanese Patent Application are incorporated by reference in the present application.

FIELD

Embodiments described herein generally relate to a semiconductor protection circuit.

BACKGROUND

A technique that provides a protection element between a gate and a source of a MOS transistor in order to protect the gate of the MOS transistor has been disclosed conventionally. A gate to a source of a MOS transistor may be subjected to positive and negative overvoltages. Therefore, a semiconductor protection circuit that executes a protection operation against positive and negative overvoltages is provided with high versatility. Furthermore, a semiconductor protection circuit is configured integrally with a MOS transistor in a power source circuit or the like. Therefore, it is desired that a semiconductor protection circuit is provided with a configuration that facilitates integration.

DETAILED DESCRIPTION

According to one embodiment, a semiconductor protection circuit includes a first MOS transistor that has a drain that is connected to an input terminal, a source that is connected to an output terminal, and a gate that is connected to a control terminal, a second MOS transistor that has a drain that is connected to the gate of the first MOS transistor and a source that is connected to the source of the first MOS transistor, a rectifier element that is connected in a forward direction from a gate of the second MOS transistor to the gate of the first MOS transistor, and a low-pass filter that is connected between the gate and the source of the second MOS transistor.

Hereinafter, a semiconductor protection circuit according to an embodiment will be explained in detail with reference to the accompanying drawings. Additionally, the present invention is not limited by these embodiments.

First Embodiment

Figure 1:
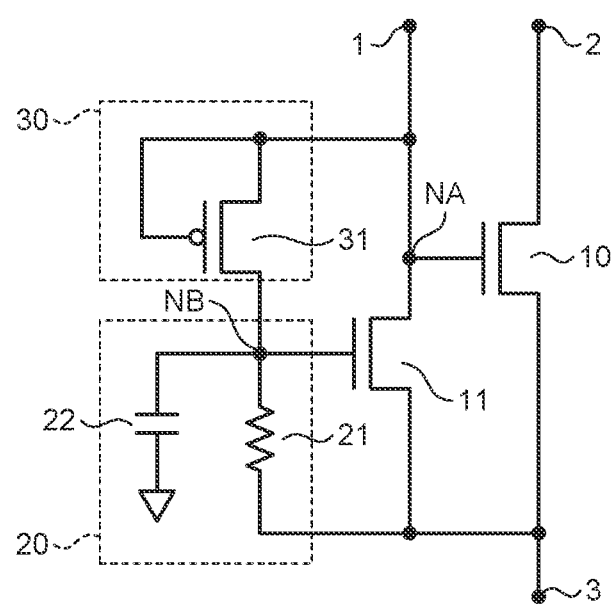
FIG. 1 is a diagram that illustrates a configuration of a semiconductor protection circuit according to a first embodiment.

FIG. 1 is a diagram that illustrates a configuration of a semiconductor protection circuit according to a first embodiment. The present embodiment has an NMOS transistor 10. A drain of the NMOS transistor 10 is connected to an input terminal 2 and a source thereof is connected to an output terminal 3. A gate of the NMOS transistor 10 is connected to a node NA. The node NA is connected to a control terminal 1. The NMOS transistor 10 is composed of, for example, a Double Diffused MOS (DMOS) transistor with a high withstand voltage. Hereinafter, the NMOS transistor 10 may conveniently be called an output transistor 10. The output transistor 10 is composed of an N-channel type MOS transistor where a material thereof is not limited to Si (silicon) and may be GaN (gallium nitride) and/or SiC (silicon carbide). For example, for an MOS transistor where a material thereof is GaN, a main current path between a drain and a source thereof is composed of GaN, and for an MOS transistor where a material thereof is SiC, a source-drain path thereof is composed of SiC. An MOS transistor that is composed of GaN and/or SiC is of a high withstand voltage, and hence, is preferable as the output transistor 10 of a power source circuit. A transistor where a material thereof is Si, a transistor where a material thereof is GaN, and a transistor where a material thereof is SiC may be called an Si transistor, a GaN transistor, and an SiC transistor, respectively.

The present embodiment has an NMOS transistor 11. A drain of the NMOS transistor 11 is connected to the gate of the output transistor 10 and a source thereof is connected to the source of the output transistor 10.

The present embodiment has a rectifier element 30 that is connected in a forward direction from a gate of the NMOS transistor 11 to the gate of the output transistor 10. The rectifier element 30 according to the present embodiment has a diode connection PMOS transistor 31 with a source and a gate that are connected to the gate of the output transistor 10 and a drain that is connected to the gate of the NMOS transistor 11.

The present embodiment has a low-pass filter 20 that is connected between the gate and the source of the NMOS transistor 11. The gate of the NMOS transistor 11 is connected to a node NB. The low-pass filter 20 according to the present embodiment has a resistor 21 with one end that is connected to the node NB and the other end that is connected to the source of the NMOS transistor 11 and a capacitor 22 with one end that is connected to the node NB and the other end that is grounded. Additionally, a voltage that is applied to the other end of the capacitor 22 is not limited to a ground voltage and may be any predetermined fixed voltage.

Figure 2:
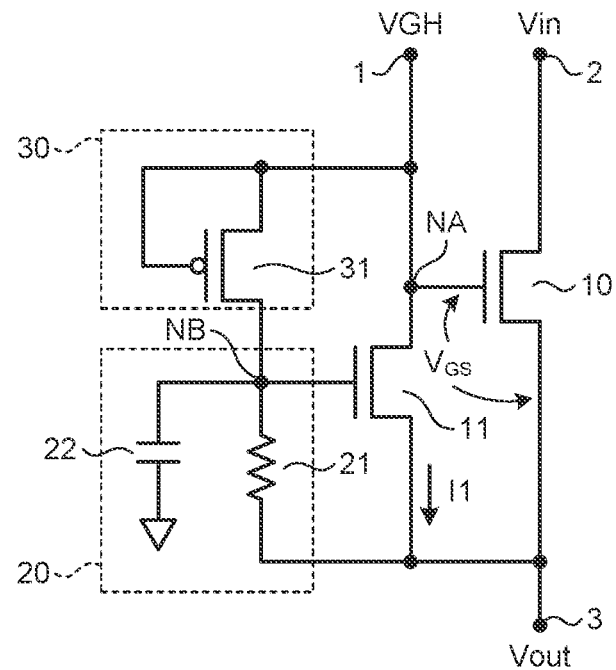
FIG. 2 is a diagram for explaining a first protection operation of a semiconductor protection circuit according to a first embodiment.
Figure 3:
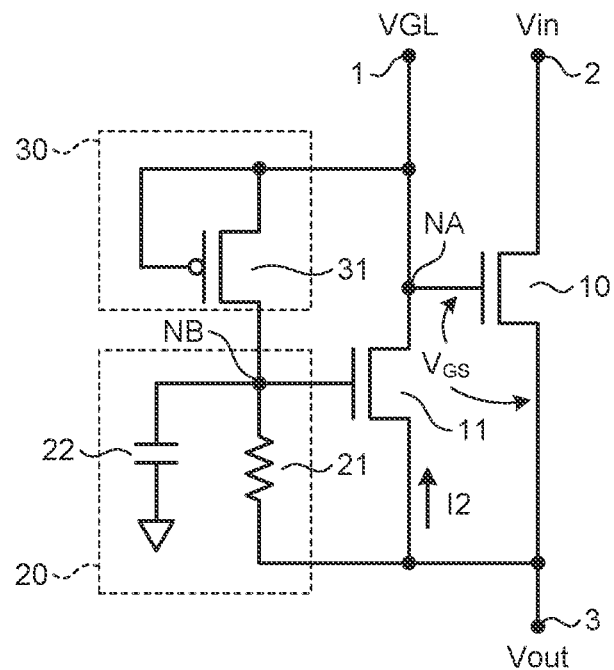
FIG. 3 is a diagram for explaining a second protection operation of a semiconductor protection circuit according to a first embodiment.

A protection operation according to the present embodiment will be explained by using FIG. 2 and FIG. 3. FIG. 2 is a diagram for explaining a first protection operation of a semiconductor protection circuit according to the present embodiment. The first protection operation is a protection operation of the output transistor 10 in a case where an output voltage Vout at the output terminal 3 varies.

An input voltage Vin is applied to the input terminal 2. When a control signal VGH at an H level is applied to the control terminal 1 and the output transistor 10 is provided in an on-state thereof, an output voltage Vout that is lower than an input voltage Vin by a voltage drop between the source and the drain of the output transistor 10 is output from the output terminal 3. An output voltage Vout at the output terminal 3 is supplied to a load (non-illustrated).

For example, in a case where an output voltage Vout is rapidly decreased by an earth fault or the like, a gate-source voltage $V_{GS}$ of the output transistor 10 is limited by a first protection operation that will be explained below, so that the gate of the output transistor 10 is protected.

Against a rapid decrease of an output voltage Vout at the output terminal 3, a voltage at the node NB is gradually decreased depending on a time constant that is determined by the resistor 21 and the capacitor 22, by an action of the low-pass filter 20. Hence, a voltage between the gate and the source of the NMOS transistor 11 is a threshold voltage of the NMOS transistor 11 or higher, so that the NMOS transistor 11 is provided in an on-state thereof and a current I1 flows through the NMOS transistor 11.

When the NMOS transistor 11 is provided in an on-state thereof, a gate-source voltage $V_{GS}$ of the output transistor 10 is limited by a voltage between the source and the drain of the NMOS transistor 11. A voltage between the source and the drain of the NMOS transistor 11 at a time when the NMOS transistor 11 is provided in an on-state thereof is substantially 0V. Hence, a gate-source voltage $V_{GS}$ of the output transistor 10 is substantially 0V, so that it is possible to protect the output transistor 10 from breakage of the gate that is caused by application of an overvoltage thereto.

Next, a second protection operation will be explained. FIG. 3 is a diagram for explaining a second protection operation of a semiconductor protection circuit according to a first embodiment. The second protection operation is a protection operation against a state where a voltage on a side of the gate of the output transistor 10 relative to the source thereof is decreased and an overvoltage where the voltage on a side of the gate of the output transistor 10 is lower than the source thereof is applied thereto. For example, in a steady state where the output transistor 10 is provided in an on-state thereof and an output voltage Vout that is substantially equal to an input voltage Vin is output from the output terminal 3, it is a protection operation of the output transistor 10 in a case where the output transistor 10 is turned off.

In a steady state, an output voltage Vout that is lower than an input voltage Vin by a voltage drop between the source and the drain of the output transistor 10 is output from the output terminal 3. In a case where the output transistor 10 is turned off, a control signal VGL at an L level, for example, 0V is applied to the control terminal 1. A control signal VGL that is applied to the control terminal 1 is applied to a gate of a PMOS transistor 31, so that the PMOS transistor 31 is turned on by a voltage difference that is generated between the gate and a drain of the PMOS transistor 31. That is, a gate voltage of the PMOS transistor 31 is decreased, so that the drain of the PMOS transistor 31 that is connected to the node NB functions as a source thereof and the PMOS transistor 31 is provided in an on-state thereof.

The gate to the drain of the NMOS transistor 11 is biased by a voltage between the source and the drain of the PMOS transistor 31 at a time when the PMOS transistor 31 is provided in an on-state thereof. That is, a potential at the gate of the NMOS transistor 11 is higher than that at the drain thereof. Herein, the NMOS transistor 11 is provided in an on-state thereof by a reversible operation where the drain of the NMOS transistor 11 that is connected to the node NA functions as the source thereof, that is, an operation where the drain that is supplied with a voltage that is lower than a gate voltage functions as the source thereof, so that a current I2 flows through the NMOS transistor 11.

As the NMOS transistor 11 is provided in an on-state thereof, a gate-source voltage $V_{GS}$ of the output transistor 10 is limited by a voltage between the source and the drain of the NMOS transistor 11. That is, in a case where a state where a control signal VGL at an L level is applied to the control terminal 1 and an overvoltage is applied between the gate and the source of the output transistor 10 is provided, a gate-source voltage $V_{GS}$ of the output transistor 10 is limited, so that it is possible to protect the gate of the output transistor 10.

In a case where the gate and the source of the PMOS transistor 31 are connected so as to compose diode connection, a body diode (non-illustrated) is also formed where a drain side and a source side of the PMOS transistor 31 are provided as an anode and a cathode, respectively. Therefore, a configuration is provided in such a manner that a body diode and a diode that is composed of a channel of the PMOS transistor 31 are connected in parallel at a time when the PMOS transistor 31 with diode connection where the source and the gate thereof are connected is provided in an on-state thereof. Hence, an on-resistance of the PMOS transistor 31 with diode connection where the gate and the source thereof are connected is decreased, so that it is possible to suppress a bias voltage between the gate and the drain of the NMOS transistor 11 so as to be a low voltage. The gate to the drain of the NMOS transistor 11 is biased by a bias voltage that is suppressed by the diode-connected PMOS transistor 31, so that it is possible to suppress a current I2 that flows through the NMOS transistor 11 and suppress power that is consumed by the second protection operation.

According to the present embodiment, in both a case where a gate voltage of the output transistor 10 is higher than that of the source of the output transistor 10 by a variation of an output voltage Vout at the output terminal 3 and a case where a gate voltage of the output transistor 10 is lower than that of the source of the output transistor 10 as a control signal VGL at an L level is applied to the control terminal 1, that is, even in any of states where positive and negative overvoltages are applied between the gate and the source of the output transistor 10, it is possible to protect the gate of the output transistor 10.

In the present embodiment, even in a case where a state where any of positive and negative overvoltages is applied between the gate and the source of the output transistor 10 is provided, a gate-source voltage $V_{GS}$ of the output transistor 10 is limited by the first and second protection operations, so that it is possible to protect the gate of the output transistor 10. Hence, it is possible to provide a semiconductor protection circuit with high versatility. Furthermore, it is possible to provide the capacitor 22 that composes the low-pass filter 20 and is composed of, for example, about 1 picofarad (pF), so that it is possible to readily execute integration with the output transistor 10 so as to provide high versatility. Furthermore, the protection operations are executed by the NMOS transistor 11 that is an active element, so that a response speed is high and high-speed protection operations are allowed.

Moreover, a current I2 that flows through the NMOS transistor 11 in the second protection operation is a slight amount of a current that flows as the gate to the drain of the NMOS transistor 11 is biased by a voltage that is about a threshold voltage of the PMOS transistor 31, so that it is possible to suppress power consumption. Control to turn off the output transistor 10 is executed, for example, in a case where energy of a load (non-illustrated) that is connected to the output terminal 3 is conserved. Therefore, the present embodiment where it is possible to suppress power that is consumed in the second protection operation provides a configuration with high versatility.

Figure 4:
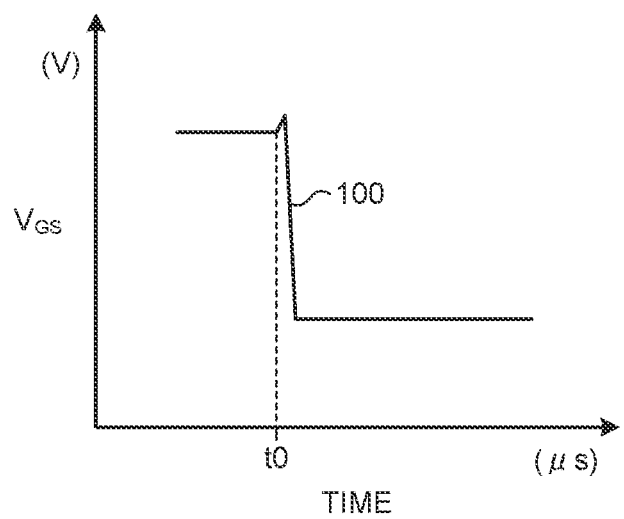
FIG. 4 is a diagram for explaining an effect of a protection operation of a semiconductor protection circuit according to a first embodiment.
Figure 4:
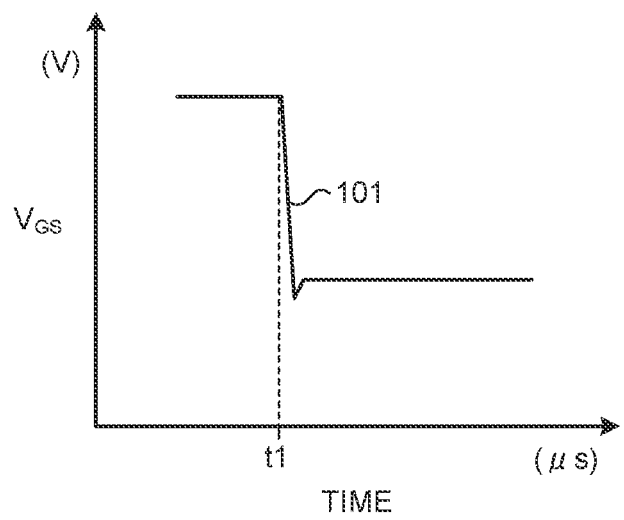

FIG. 4 is a diagram for explaining an effect of a protection operation of a semiconductor protection circuit according to a first embodiment. An upper section of FIG. 4 illustrates a simulation result of the first protection operation as described. A horizontal axis and a vertical axis represent a time and a gate-source voltage $V_{GS}$ of the output transistor 10, respectively.

At a timing to, an output voltage Vout is rapidly decreased. A gate-source voltage $V_{GS}$ as indicated by a solid line 100 is instantaneously overshot. As already described, as the NMOS transistor 11 is turned on, a gate-source voltage $V_{GS}$ is limited by a source-drain voltage of the NMOS transistor 11 and is stabilized at substantially 0V. Additionally, for a gate-source voltage $V_{GS}$ as illustrated in the upper section, a gate voltage of the output transistor 10 is illustrated as a plus voltage while a source voltage of the output transistor 10 is a reference thereof.

A lower section thereof illustrates a simulation result of the second protection operation as described. At a timing t1, a control signal VGL at an L level is applied to the control terminal 1. A gate-source voltage $V_{GS}$ as indicated by a solid line 101 is instantaneously undershot. As already described, as the NMOS transistor 11 is turned on, a gate-source voltage $V_{GS}$ of the output transistor 10 is limited by a voltage between the source and the drain of the NMOS transistor 11 and is stabilized at substantially 0V. Additionally, for a gate-source voltage $V_{GS}$ as illustrated in the lower section, a source voltage of the output transistor 10 is illustrated as a plus voltage while a gate voltage of the output transistor 10 is a reference thereof.

As indicated by the simulation results in FIG. 4, even in a case where a state where any of positive and negative overvoltages is applied between the gate and the drain of the output transistor 10 is caused, a gate-source voltage $V_{GS}$ of the output transistor 10 is limited to a voltage between the source and the drain of the NMOS transistor 11 by the first and second protection operations, so that the gate of the output transistor 10 is protected.

Second Embodiment

Figure 5:
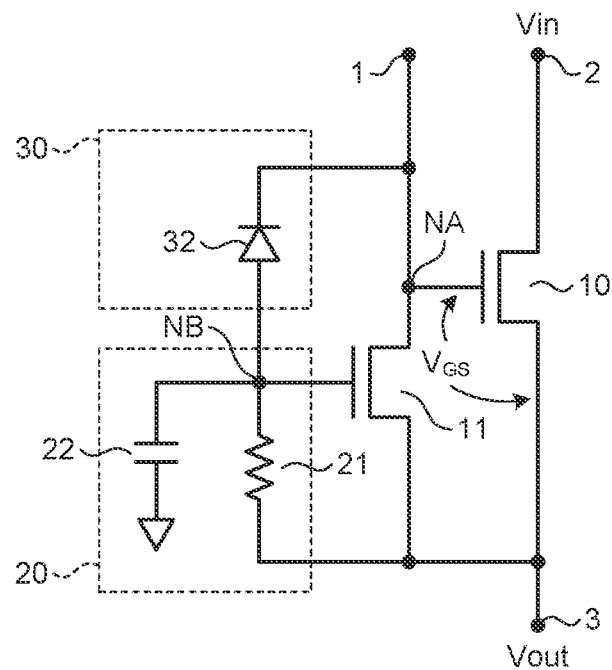
FIG. 5 is a diagram that illustrates a configuration of a semiconductor protection circuit according to a second embodiment.

FIG. 5 is a diagram that illustrates a configuration of a semiconductor protection circuit according to a second embodiment. A component that corresponds to that of an embodiment as already described will be provided with an identical sign so as to provide a redundant description only in case of need. Hereinafter, the same applies. A rectifier element 30 according to the present embodiment has a diode 32. An anode of the diode 32 is connected to a node NB and a cathode thereof is connected to a node NA. That is, the diode 32 is connected in a forward direction from a gate of an NMOS transistor 11 to a gate of an output transistor 10.

A first protection operation according to the present embodiment, that is, a protection operation at a time when a state where an output voltage Vout at an output terminal 3 is rapidly decreased and an overvoltage where a voltage of the gate of the output transistor 10 is higher than that of a source thereof is applied thereto is caused is as follows.

Against a rapid decrease of an output voltage Vout at the output terminal 3, a potential at the node NB is gradually deceased depending on a time constant that is determined by a resistor 21 and a capacitor 22 by an action of a low-pass filter 20. Hence, a gate voltage of the NMOS transistor 11 relative to a source voltage thereof is a threshold voltage of the NMOS transistor 11 or higher, so that the NMOS transistor 11 is provided in an on-state thereof and a current flows therethrough. Herein, a gate-source voltage $V_{GS}$ of the output transistor 10 is limited by a voltage between a source and a drain of the NMOS transistor 11.

A voltage between the source and the drain of the NMOS transistor 11 at a time when the NMOS transistor 11 is provided in an on-state thereof is substantially 0V. Hence, a gate-source voltage $V_{GS}$ of the output transistor 10 is substantially 0V, so that it is possible to protect the gate of the output transistor 10 from breakage that is caused by application of an overvoltage thereto.

A second protection operation according to the present embodiment, that is, a protection operation against a state where a gate voltage of the output transistor 10 relative to a source voltage thereof is decreased and an overvoltage where a gate voltage of the output transistor 10 is lower than a source voltage thereof is applied is as follows.

In a steady state, as a control signal VGL at an L level, for example, 0V is applied to a control terminal 1 in a state where an output voltage Vout that is substantially equal to an input voltage Vin is output to the output terminal 3, a response of a voltage at the node NB to application of the control signal VGL is late, so that a voltage difference that corresponds to a forward voltage of the diode 32 is generated between the gate and the drain of the NMOS transistor 11 and the gate to the drain of the NMOS transistor 11 is biased by such a voltage difference. That is, a gate voltage of the NMOS transistor 11 is higher than a drain voltage thereof by a forward voltage of the diode 32, and by a reversible operation of the NMOS transistor 11, that is, an operation where the drain where a voltage that is lower than the gate voltage is applied functions as the source, the NMOS transistor 11 is provided in an on-state thereof and a current flows therethrough.

As the NMOS transistor 11 is provided in an on-state thereof, a gate-source voltage $V_{GS}$ of the output transistor 10 is limited by a voltage between the source and the drain of the NMOS transistor 11. That is, when a control signal VGL at an L level is applied to the control terminal 1, it is possible to avoid a state where an overvoltage is applied between the gate and a source of the output transistor 10, and protect the gate of the output transistor 10.

According to the present embodiment, even when a situation where any of positive and negative overvoltages is applied between the gate and the source of the output transistor 10 is caused, a gate-source voltage $V_{GS}$ of the output transistor 10 is limited to a predetermined voltage by the first and second protection operations, so that it is possible to protect the gate of the output transistor 10. Hence, it is possible to provide a semiconductor protection circuit with high versatility. Furthermore, a current that flows through the NMOS transistor 11 in the second protection operation is a slight amount of a current that flows as the gate to the drain of the NMOS transistor 11 is biased by a voltage that is about a forward voltage of the diode 32, so that it is possible to suppress power consumption.

Third Embodiment

Figure 6:
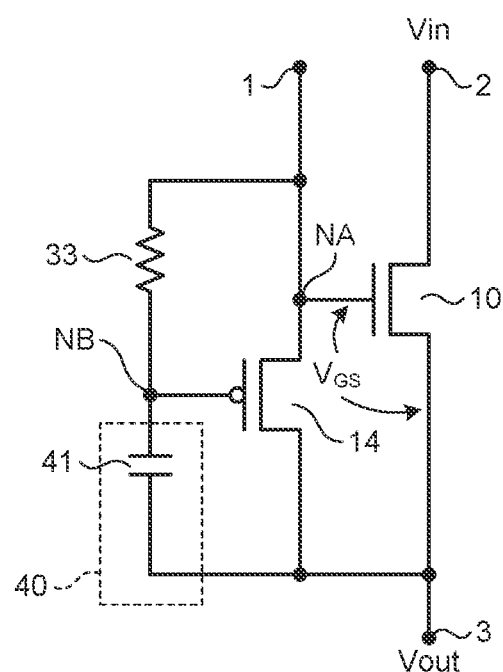
FIG. 6 is a diagram that illustrates a configuration of a semiconductor protection circuit according to a third embodiment.

FIG. 6 is a diagram that illustrates a configuration of a semiconductor protection circuit according to a third embodiment. The present embodiment has a PMOS transistor 14 with a source that is connected to a gate of an output transistor 10 and a drain that is connected to a source of the output transistor 10. A gate of the PMOS transistor 14 is connected to a node NB.

The present embodiment has a high-pass filter 40 that is connected between the node NB and the drain of the PMOS transistor 14. That is, the high-pass filter 40 is connected between the gate and the drain of the PMOS transistor 14. The high-pass filter 40 has a capacitor 41 with one end that is connected to the gate of the PMOS transistor 14 and the other end that is connected to the drain of the PMOS transistor 14.

The present embodiment has a resistor 33 with one end that is connected to the node NB and the other end that is connected to the gate of the output transistor 10. The resistor 33 supplies a voltage that is applied to a control terminal 1 to the node NB in a steady state.

A first protection operation according to the present embodiment, that is, a protection operation in a case where a state where an output voltage Vout at an output terminal 3 is rapidly decreased and an overvoltage where a voltage of the gate of the output transistor 10 is higher than that of the source thereof is applied is caused is as follows.

A rapid decrease of an output voltage Vout at the output terminal 3 rapidly decreases a voltage at the node NB by a level shift function of the capacitor 41 that composes the high-pass filter 40. Thereby, a potential at the node NB is rapidly decreased and a voltage drop that is a threshold or higher is caused between the gate and the source of the PMOS transistor 14, so that the PMOS transistor 14 is turned on.

As the PMOS transistor 14 is turned on, a gate-source voltage $V_{GS}$ of the output transistor 10 is limited by a voltage between the source and the drain of the PMOS transistor 14. A voltage between the source and the drain of the PMOS transistor 14 in an on-state thereof is substantially 0V. It is possible to avoid applying an overvoltage between the gate and the source of the output transistor 10, so that it is possible to protect the gate of the output transistor 10. Additionally, the high-pass filter 40 is not limited to a configuration that has only the capacitor 41.

According to the present embodiment, it is possible to avoid application of an overvoltage to the gate to the source of the output transistor 10 that is caused by a rapid decrease of an output voltage Vout, and protect the gate of the output transistor 10. It is possible to provide the capacitor 41 that composes the high-pass filter 40, with a value of, for example, about 1 picofarad (pF), so that it is possible to provide a semiconductor protection circuit with high versatility that is readily integrated. Furthermore, the protection operation is provided by the PMOS transistor 14 that is an active element, so that a response speed is high and a high-speed protection operation is allowed.

Fourth Embodiment

Figure 7:
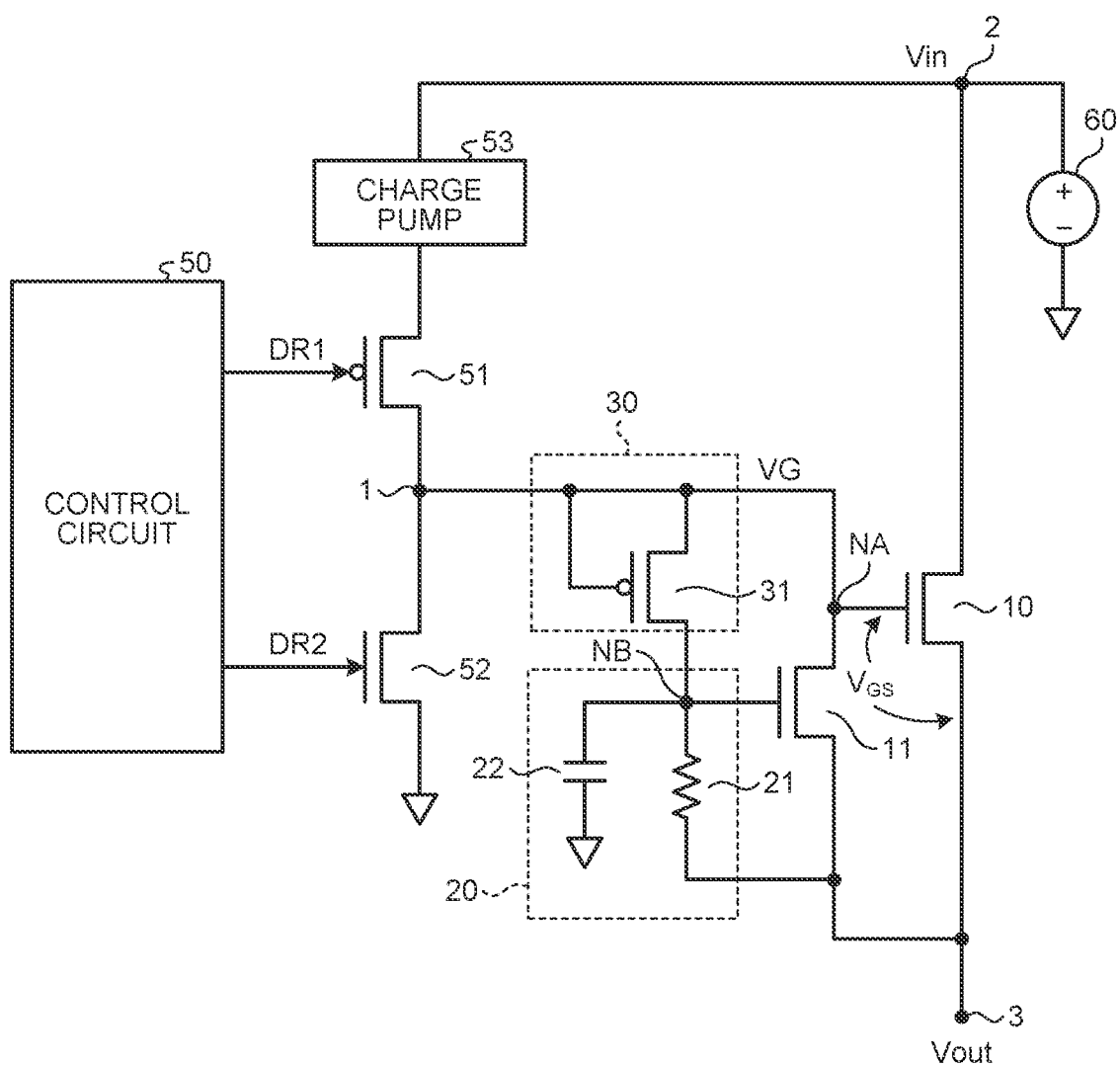
FIG. 7 is a diagram that illustrates a configuration of a semiconductor protection circuit according to a fourth embodiment.

FIG. 7 is a diagram that illustrates a configuration of a semiconductor protection circuit according to a fourth embodiment. The present embodiment has a PMOS transistor 51 with a drain that is connected to a control terminal 1 and a source that is connected to a charge pump 53 and an NMOS transistor 52 with a drain that is connected to the control terminal 1 and a source that is grounded.

The charge pump 53 outputs a voltage that is provided by boosting an input voltage Vin that is supplied by a power source 60. A control circuit 50 supplies driving signals DR1, DR2 to gates of the PMOS transistor 51 and the NMOS transistor 52, respectively, so as to control on/off of the PMOS transistor 51 and the NMOS transistor 52.

As the PMOS transistor 51 is turned on by a driving signal DR1, a voltage that is provided as an input voltage Vin is boosted by the charge pump 53 is applied to the control terminal 1 as a control signal VG. As the NMOS transistor 52 is turned on by a driving signal DR2, a ground voltage is applied to the control terminal 1 as a control signal VG. A voltage that is supplied by the charge pump 53 is a control signal VGH as already described and a ground voltage that is supplied to the control terminal 1 as the NMOS transistor 52 is turned on is a control signal VGL as already described.

As an output voltage Vout at an output terminal 3 is rapidly decreased in a state where a driving signal VGH is applied to the control terminal 1, a gate-source voltage $V_{GS}$ of an output transistor 10 is limited to a voltage between a source and a drain of an NMOS transistor 11 by a first protection operation as already described.

In a steady state, as a control signal VGL at an L level, for example, 0V is applied to the control terminal 1 in a state where an output voltage Vout that is substantially equal to an input voltage Vin is output to the output terminal 3, a gate-source voltage $V_{GS}$ of the output transistor 10 is limited to a voltage between the source and the drain of the NMOS transistor 11 by a second protection operation as already described. That is, when a control signal VGL at an L level is applied to the control terminal 1, it is possible to avoid a state where an overvoltage is applied between a gate and a source of the output transistor 10 and protect a gate of the output transistor 10.

The present embodiment provides a power circuit that is configured to control on/off of the output transistor 10 by a control signal VG that is produced in response to driving signals DR1, DR2 that are supplied from the control circuit 50 so as to control an output voltage Vout. According to the present embodiment, even in a case where a situation where any of positive and negative overvoltages may be applied to the gate to the source of the output transistor 10 is caused, a gate-source voltage $V_{GS}$ of the output transistor 10 is limited to a voltage between the source and the drain of the NMOS transistor 11 by the first and second protection operations, so that it is possible to protect the gate of the output transistor 10, and hence, provide a configuration with high versatility.

Fifth Embodiment

Figure 8:
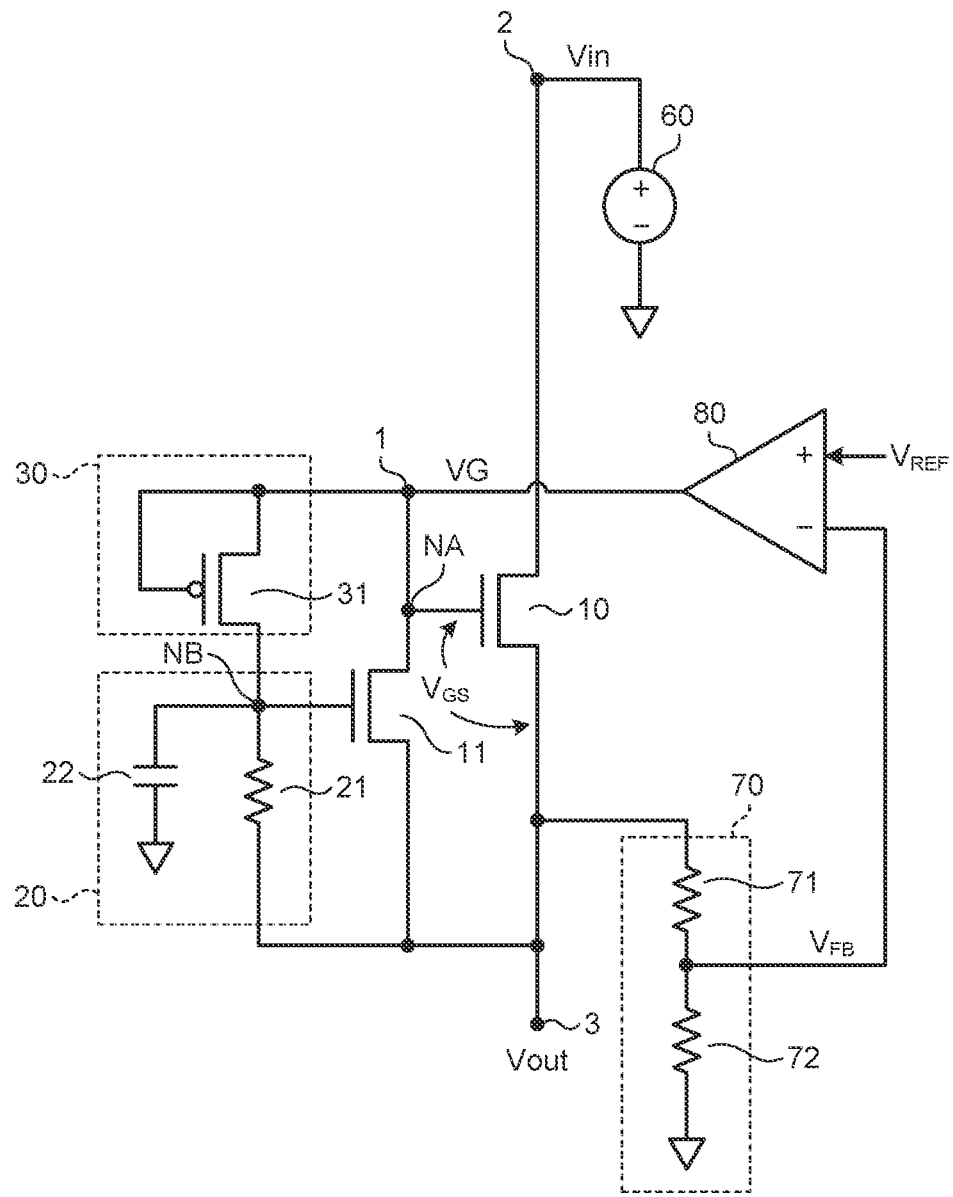
FIG. 8 is a diagram that illustrates a configuration of a semiconductor protection circuit according to a fifth embodiment.

FIG. 8 is a diagram that illustrates a configuration of a semiconductor protection circuit according to a fifth embodiment. The present embodiment has a voltage-dividing circuit 70. The voltage-dividing circuit 70 divides an output voltage Vout by a resistance ratio of a resistor 71 and a resistor 72 so as to output a feedback voltage $V_{FB}$.

The present embodiment has an error amplifier 80 that compares a feedback voltage $V_{FB}$ and a reference voltage $V_{REF}$ and outputs a control signal VG depending on a difference voltage between the feedback voltage $V_{FB}$ and the reference voltage $V_{REF}$. The error amplifier 80 composes a control loop that adjusts a conduction state of an output transistor 10 in such a manner that a feedback voltage $V_{FB}$ is equal to a reference voltage $V_{REF}$.

As a feedback voltage $V_{FB}$ is higher than a reference voltage $V_{REF}$, a control signal VG that is output by the error amplifier 80 is provided at an L level, and as a feedback voltage $V_{FB}$ is lower than a reference voltage $V_{REF}$, a control signal VG is provided at an H level. A gate voltage of the output transistor 10 is controlled depending on a level of a control signal VG so as to control a conduction state of the output transistor 10, and control is executed in such a manner that a feedback voltage $V_{FB}$ is equal to a reference voltage $V_{REF}$.

In a case where a state where an output voltage Vout is rapidly decreased and an overvoltage is applied between a gate and a source of the output transistor 10 at a time when a control signal VG is provided at an H level and the output transistor 10 is provided in an on-state thereof is caused, a gate-source voltage $V_{GS}$ of the output transistor 10 is limited by a voltage between a source and a drain of an NMOS transistor 11 by a first protection operation as already described, so that the gate of the output transistor 10 is protected.

In a steady state, as a control signal VG that is applied to a control terminal 1 is provided at an L level, for example, 0V in a state where an output voltage Vout that is substantially equal to an input voltage Vin is output to an output terminal 3, a gate-source voltage $V_{GS}$ of the output transistor 10 is limited by a voltage between the source and the drain of the NMOS transistor 11 by a second protection operation as already described, so that the gate of the output transistor 10 is protected.

Even in a case where a situation where any of positive and negative overvoltages is applied between the gate and the source of the output transistor 10 is caused, a value of a gate-source voltage $V_{GS}$ of the output transistor 10 is limited to a predetermined value by the first and second protection operations, so that it is possible to protect the gate of the output transistor 10.

The present embodiment provides a so-called linear regulator that is configured to control a conduction state of the output transistor 10 in such a manner that a feedback voltage $V_{FB}$ that is provided by dividing an output voltage Vout is equal to a reference voltage $V_{REF}$. Even in a case where a state where an output voltage Vout is rapidly decreased in a steady state and a positive overvoltage is applied between the gate and the source of the output transistor 10 may be provided or a case where a state where a control signal VG is provided at an L level in a steady state and a negative overvoltage is applied between the gate and the source of the output transistor 10 may be provided, the gate of the output transistor 10 is protected by the first protection operation and the second protection operation as already described, so that a configuration with high versatility is provided.

Although some embodiments of the present invention have been explained, these embodiments are presented as examples and do not intend to limit the scope of the invention. These novel embodiments are capable of being implemented in various other modes and it is possible to execute a variety of omissions, substitutions, and modifications without departing from the spirit of the invention. These embodiments and/or variations thereof are included in the scope and/or spirit of the invention and are included in the scope of the invention as recited in what is claimed and equivalents thereof.

What is claimed is:

1. A semiconductor protection circuit, comprising:
    a first MOS transistor that has a drain that is connected to an input terminal, a source that is connected to an output terminal, and a gate that is connected to a control terminal;
    a second MOS transistor that has a drain that is connected to the gate of the first MOS transistor and a source that is connected to the source of the first MOS transistor;
    a rectifier element that is connected in a forward direction from a gate of the second MOS transistor to the gate of the first MOS transistor; and
    a low-pass filter that is connected between the gate and the source of the second MOS transistor.

2. The semiconductor protection circuit according to claim 1, wherein
    the low-pass filter includes:
        a resistor that is connected between the gate and the source of the second MOS transistor; and
        a capacitor with one end that is connected to the gate of the second MOS transistor and the other end where a fixed voltage is applied thereto.

3. The semiconductor protection circuit according to claim 2, wherein
    the fixed voltage is a ground voltage.

4. The semiconductor protection circuit according to claim 2, wherein
    the rectifier element is composed of a third MOS transistor with a source and a gate that are commonly connected.

5. The semiconductor protection circuit according to claim 1, wherein
    the rectifier element is composed of a third MOS transistor with a source and a gate that are commonly connected.

6. The semiconductor protection circuit according to claim 5, wherein
    the first MOS transistor and the second MOS transistor are composed of NMOS transistors, and
    the third MOS transistor is composed of a PMOS transistor.

7. The semiconductor protection circuit according to claim 1, wherein
    the rectifier element is composed of a diode with an anode that is connected to the gate of the second MOS transistor and a cathode that is connected to the drain of the second MOS transistor.

8. The semiconductor protection circuit according to claim 7, wherein
    the low-pass filter includes:
        a resistor that is connected between the gate and the source of the second MOS transistor; and
        a capacitor with one end that is connected to the gate of the second MOS transistor and the other end where a fixed voltage is applied thereto.

9. The semiconductor protection circuit according to claim 1, wherein
    the first MOS transistor is composed of a DMOS transistor.

10. A semiconductor protection circuit, comprising:
    a first conductivity type first MOS transistor that has a drain that is connected to an input terminal, a source that is connected to an output terminal, and a gate that is connected to a control terminal;
    a second conductivity type second MOS transistor that has a source that is connected to the gate of the first MOS transistor and a drain that is connected to the source of the first MOS transistor;
    a resistance element that is connected between a gate of the second MOS transistor and the gate of the first MOS transistor; and
    a high-pass filter that is connected between the gate and the drain of the second MOS transistor.

11. The semiconductor protection circuit according to claim 10, wherein
    the high-pass filter has a capacitor.

12. The semiconductor protection circuit according to claim 10, wherein
the first MOS transistor is composed of a DMOS transistor.

13. The semiconductor protection circuit according to claim 10, wherein
the resistance element supplies a voltage applied to the control terminal to a node between the resistance element and the high-pass filter or the gate of the second MOS transistor.

14. A semiconductor protection circuit, comprising:
a first MOS transistor that has a drain that is connected to an input terminal, a source that is connected to an output terminal, and a gate that is connected to a control terminal;
a second MOS transistor that has a drain that is connected to the gate of the first MOS transistor and a source that is connected to the source of the first MOS transistor;
a rectifier element that is connected in a forward direction from a gate of the second MOS transistor to the gate of the first MOS transistor;
a low-pass filter that is connected between the gate and the source of the second MOS transistor;
a power source that supplies an input voltage to the input terminal; and
a control circuit that supplies a control signal that controls a conduction state of the first MOS transistor to the control terminal.

15. The semiconductor protection circuit according to claim 14, wherein
the control circuit includes:
a booster circuit that boosts the input voltage;
a first switch that supplies a voltage that is boosted by the booster circuit to the control terminal in response to a first control signal; and
a second switch that supplies a ground voltage to the control terminal in response to a second control signal.

16. The semiconductor protection circuit according to claim 14, wherein
the control circuit includes a differential amplifier circuit that supplies a signal that is dependent on a difference voltage between a feedback voltage of an output voltage that is output from the output terminal and a predetermined reference voltage to the control terminal.

17. The semiconductor protection circuit according to claim 14, wherein
the low-pass filter includes:
a resistor that is connected between the gate and the source of the second MOS transistor; and
a capacitor with one end that is connected to the gate of the second MOS transistor and the other end where a fixed voltage is applied thereto.

18. The semiconductor protection circuit according to claim 17, wherein
the fixed voltage is a ground voltage.

19. The semiconductor protection circuit according to claim 14, wherein
the rectifier element is composed of a third MOS transistor with a source and a gate that are commonly connected.

20. The semiconductor protection circuit according to claim 19, wherein
the first MOS transistor and the second MOS transistor are composed of NMOS transistors, and
the third MOS transistor is composed of a PMOS transistor.

21. The semiconductor protection circuit according to claim 20, wherein
the first MOS transistor is composed of a DMOS transistor.

* * * * *